(12) United States Patent
Gourevitch et al.

(10) Patent No.: US 9,391,610 B2
(45) Date of Patent: Jul. 12, 2016

(54) SINGLE LAYER TOUCHSCREEN WITH GROUND INSERTION

(71) Applicant: Parade Technologies, Ltd., Santa Clara, CA (US)

(72) Inventors: Alexandre Gourevitch, San Jose, CA (US); Igor Kravets, Lviv (UA); Oleksandr Karpin, Lviv (UA); Peter Vavaroutsos, Scotts Valley, CA (US)

(73) Assignee: PARADE TECHNOLOGIES, LTD., Santa Clara, CA (US)

( * ) Notice: Subject to any disclaimer, the term of this patent is extended or adjusted under 35 U.S.C. 154(b) by 0 days.

(21) Appl. No.: 14/491,807

(22) Filed: Sep. 19, 2014

(65) Prior Publication Data
US 2015/0349773 A1    Dec. 3, 2015

Related U.S. Application Data

(60) Provisional application No. 62/004,324, filed on May 29, 2014.

(51) Int. Cl.
G06F 3/045 (2006.01)
H03K 17/96 (2006.01)
G06F 3/044 (2006.01)

(52) U.S. Cl.
CPC ............ *H03K 17/9622* (2013.01); *G06F 3/044* (2013.01); *G06F 2203/04111* (2013.01); *H03K 2017/9615* (2013.01); *H03K 2217/960745* (2013.01); *H03K 2217/960765* (2013.01)

(58) Field of Classification Search
CPC   G06F 3/041; G06F 3/044; G06F 2203/04112
USPC ................................ 345/173, 174; 178/18.06
See application file for complete search history.

(56) References Cited

U.S. PATENT DOCUMENTS

| 8,482,546 | B2 | 7/2013 | Chai et al. |
| 8,502,796 | B1* | 8/2013 | Yilmaz ......................... 345/173 |
| 8,717,331 | B2 | 5/2014 | Kremin et al. |
| 2009/0194344 | A1 | 8/2009 | Harley et al. |
| 2010/0292945 | A1 | 11/2010 | Reynolds et al. |

(Continued)

FOREIGN PATENT DOCUMENTS

| WO |      2012115685 A1 | 8/2012 |
| WO | WO 2013/099867 A1 | 7/2013 |
| WO |      2013180438 A1 | 12/2013 |

OTHER PUBLICATIONS

Geoff Walker, Water-resistant Algorithms, Jun. 6, 2014, 3 pg.

(Continued)

*Primary Examiner* — Kent Chang
*Assistant Examiner* — Nelson Rosario
(74) *Attorney, Agent, or Firm* — Morgan, Lewis & Bockius LLP

(57) ABSTRACT

A sensor array that has first electrodes, second electrodes and third electrodes formed from a single layer of conductive material and interleaved without intersecting one another, in which each first electrode is coupled with at least one of the second electrodes via a mutual capacitance. Some of the third electrodes are disposed between the first electrodes and the second electrodes. All electrodes are interleaved without intersecting one another.

19 Claims, 14 Drawing Sheets

(56) References Cited

U.S. PATENT DOCUMENTS

| | | |
|---|---|---|
| 2012/0256877 A1 | 10/2012 | Lin et al. |
| 2013/0100041 A1 | 4/2013 | Golovchenko et al. |
| 2013/0207924 A1 | 8/2013 | Mohindra et al. |
| 2014/0049271 A1* | 2/2014 | Trend .......................... 324/663 |
| 2015/0001516 A1 | 1/2015 | Yoshida et al. |

OTHER PUBLICATIONS

Viramontes Eduardo and Pia Giuseppe, In-Depth Understanding of Water Tolerance Feature in Touch-Sensing Software Library, Freescale Semiconductor, Inc., Sep. 2013, 13 pg.

Cypress, ISRWO, PCT/US2015/028424, Aug. 5, 2015, 9 pgs.

* cited by examiner

SINGLE LAYER TOUCHSCREEN WITH GROUND INSERTION

PRIORITY

The present application claims the priority and benefit of U.S. Provisional Application No. 62/004,324, which was filed on May 29, 2014 and which is incorporated by reference herein in its entirety.

TECHNICAL FIELD

This disclosure generally relates to the field of touch-sensing devices and, in particular, to insertion electrodes in capacitive touch-sensing arrays.

BACKGROUND

Computing devices, such as notebook computers, personal digital assistants, mobile communication devices, portable entertainment devices (e.g., handheld video games, multimedia players, etc.), and set-top-boxes (e.g., digital cable boxes, digital video disc (DVD) players, etc.) may include user interface devices that facilitate interaction between a user and the computing device. One type of user interface device that has become common is a touch-sensing device or touch input device that operates by way of capacitive sensing. A touch-sensing device may be embodied as a touchscreen, touch-sensing pad, touch-sensing slider, or touch-sensing buttons, and may include a touch sensor comprising an array of capacitive sensor elements. Capacitive sensing typically involves scan operations that periodically measure changes in capacitance associated with the capacitive sensor elements to determine a presence, position, and/or movement of a conductive object (e.g., a stylus, a user's finger, etc.) relative to the touch sensor.

Touch sensors are an expensive part of a touch-sensing device or the user interface system thereof. One reason for the high manufacturing cost of touch sensors is that conventional sensors use either multiple layers of electrode materials formed on multiple substrates or a single substrate with a series of "jumpers" to form electrical connection between the individual electrode segments and to insulate them from the other electrodes that intersect them. One way to reduce the high cost of touch sensors is to route the trace portions (or segments) of electrodes tightly together on the active area of a single substrate without the use of "jumpers". However, this type of sensor construction leads to increased capacitive cross-coupling between the electrodes (e.g., especially in response to a conductive object touch), thereby causing false touches, inaccuracy, and poor touch-response linearity, all of which limit the functionality of the touch-sensing device and/or lead to poor user experience.

BRIEF DESCRIPTION OF THE DRAWINGS

The present disclosure is illustrated by way of example, and not by way of limitation, in the FIGS. of the accompanying drawings.

DETAILED DESCRIPTION

Figure 1:
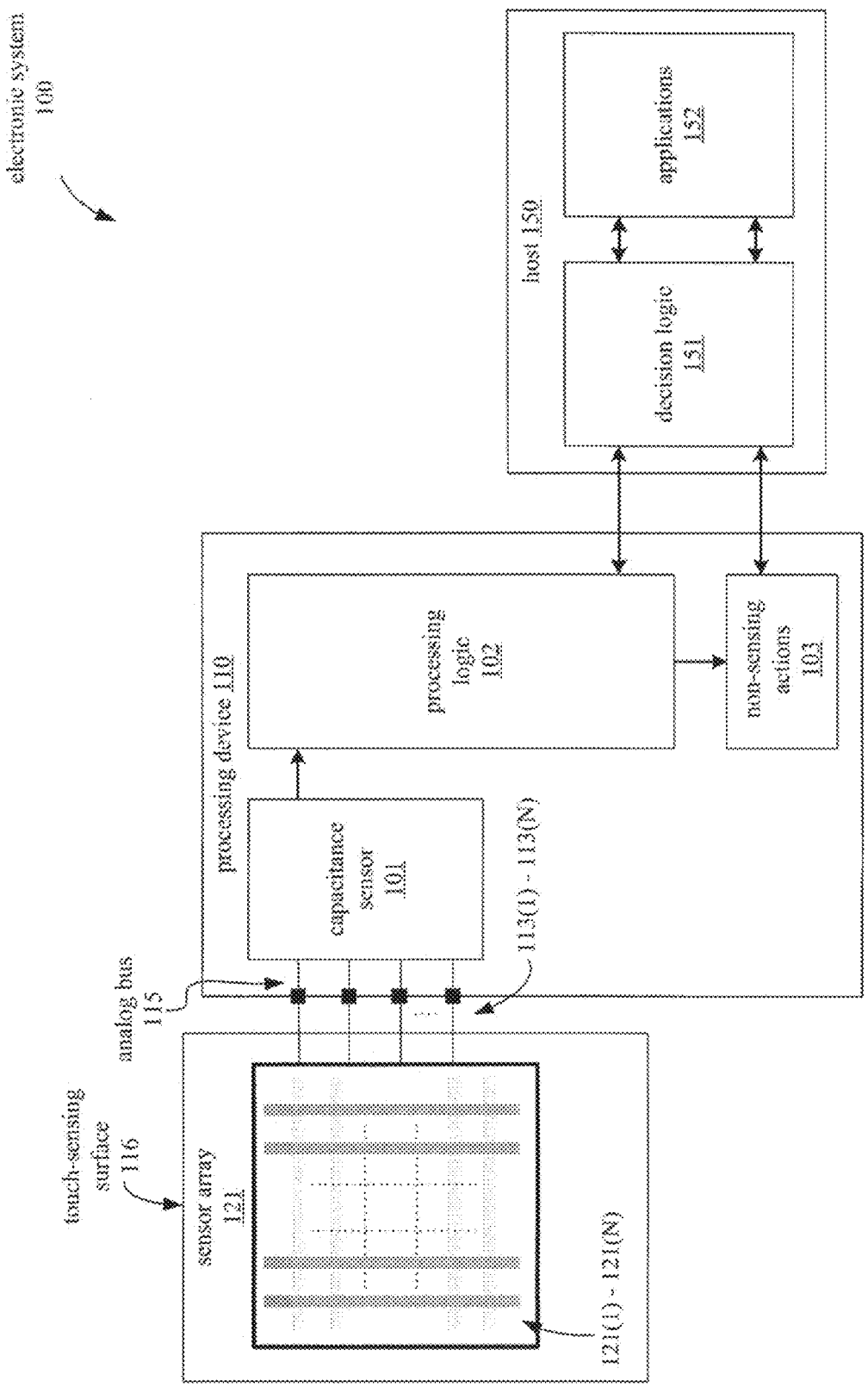
FIG. 1 is a block diagram illustrating an embodiment of an example electronic system that includes touch sensor components.

The following description sets forth numerous specific details such as examples of specific systems, components, methods, and so forth, in order to provide a good understanding of several embodiments of the present invention. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present invention.

Reference in the description to "an embodiment", "one embodiment", "an example embodiment", "some embodiments", and "various embodiments" means that a particular feature, structure, or characteristic described in connection with the embodiment(s) is included in at least one embodiment of the invention. Further, the appearances of the phrases "an embodiment", "one embodiment", "an example embodiment", "some embodiments", and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Overview

Described herein are various embodiments of techniques for designs of a touch sensor with mutual-capacitance and/or self-capacitance electrodes that are arranged in the same (e.g., single) layer of the substrate of the touch sensor. Unless expressly specified otherwise, "touch sensors" are also referred to herein as "sensor arrays", "touch sensor arrays", "touch panels", "touch sensor panels", and the like.

As used herein, "contact" refers to a physical touch of a conductive object (e.g., a stylus, a user's finger, and the like) on a stack-up including a touch sensor and/or to a hover in which the conductive object is sufficiently proximate to affect the sensor elements of the touch sensor without being in physical touch with the touch-surface of the sensor. As used herein, "sensor element" (also referred to as "unit cell") refers to a discrete unit or location area (e.g., adjacency) of electrodes from which a measurement or signal can be obtained that is separate and distinct from measurements/signals obtained from other units or location areas in the touch sensor.

In single-layer touch sensors that use interleaved (also referred to as "interlaced) electrodes without "jumpers", a conductive object may affect portions (also referred to as "segments") from multiple electrodes, thereby causing a change in the capacitance even of electrodes that are not directly under the contact by the conductive object and that should not register or otherwise detect the contact. Such parasitic signal coupling outside of the actual touch-sensing area affected by the contact causes a parasitic signal increase or a parasitic signal decrease (e.g., depending on the type of sensing mechanism used by the touch sensor). Such parasitic signal increase or decrease in one or more sensor elements of a touch sensor is referred to herein as a "tail effect" and a "tail effect signal".

In a capacitive touch-sensing system utilizing a capacitive touch sensor array, costs may be reduced and manufacturing yield increased by constructing the touch sensor array from a single layer of conductive material. For a single-layer sensor array pattern, the pattern may include a single layer of copper, indium-tin oxide (ITO), or other conductive material without any overlapping portions. In one embodiment, such a single layer of conductive material may include different types of conductive materials. For example, part of the single layer may be constructed from ITO while another part may be constructed from copper. In one embodiment, substantially all portions of the single layer of conductive material may lie substantially on a single plane or surface. For example, the single layer of conductive material may conform to the surface of a substrate such as glass or plastic. An embodiment of a single-layer sensor array pattern may further maximize its sensitivity to capacitance changes by minimizing the area occupied by routing channels that connect the sensor electrodes to the edge of the capacitive sensor array.

In one embodiment, a single-layer sensor pattern may have a reduced number of electrodes in order to reduce the space occupied by the routing channel; in such an embodiment, the resolution of the sensor pattern may be maintained by subdividing some of the electrodes. In one embodiment, this arrangement results in a capacitive sensor array that includes a first set of sensor electrodes each made up of one or more large subelements and a second set of sensor electrodes each made up of one or more smaller subelements. In one embodiment, each of the large sensor electrode subelements may be capacitively coupled with two or more of the smaller subelements. Thus, the resolution of the sensor array is increased at least in part because a mutual capacitance can be separately measured between the large subelement and either of the two smaller subelements.

In one embodiment, a capacitance sensor coupled with a capacitive sensor array as described above may be used to scan the capacitive sensor array by measuring the self capacitances associated with each sensor electrode, or the mutual capacitances between pairs of sensor electrodes. The capacitance sensor may then transmit the measured capacitance values to a host, where the capacitance values may be further processed to determine, for example, locations of fingers or other conductive objects near or touching the surface of the capacitive sensor array. In one embodiment, the host compensates for the capacitance differences between the regions having different patterns of conductive traces.

FIG. 1 illustrates a block diagram of one embodiment of an electronic system 100 including a processing device 110 that may be configured to measure capacitances from a touch sensing surface 116 including a capacitive sensor array as described above. The electronic system 100 includes a touch-sensing surface 116 (e.g., a touchscreen or a touch pad) coupled to the processing device 110 and a host 150. In one embodiment, the touch-sensing surface 116 is a two-dimensional user interface that uses a sensor array 121 to detect touches on the surface 116.

In one embodiment, the sensor array 121 includes sensor electrodes 121(1)-121(N) (where N is a positive integer) that are disposed as a two-dimensional matrix (also referred to as an XY matrix). The sensor array 121 is coupled to pins 113(1)-113(N) of the processing device 110 via one or more analog buses 115 transporting multiple signals. In this embodiment, each sensor electrode or electrode 121(1)-121(N) is represented as a capacitor.

In one embodiment, the capacitance sensor 101 may include a relaxation oscillator or other means to convert a capacitance into a measured value. The capacitance sensor 101 may also include a counter or timer to measure the oscillator output. The processing device 110 may further include software components to convert the count value (e.g., capacitance value) into a sensor electrode detection decision (also referred to as switch detection decision) or relative magnitude. It should be noted that there are various known methods for measuring capacitance, such as current versus voltage phase shift measurement, resistor-capacitor charge timing, capacitive bridge divider, charge transfer, successive approximation, sigma-delta modulators, charge-accumulation circuits, field effect, mutual capacitance, frequency shift, or other capacitance measurement algorithms. It should be noted however, instead of evaluating the raw counts relative to a threshold, the capacitance sensor 101 may be evaluating other measurements to determine the user interaction. For example, in the capacitance sensor 101 having a sigma-delta modulator, the capacitance sensor 101 is evaluating the ratio of pulse widths of the output, instead of the raw counts being over or under a certain threshold.

In one embodiment, the processing device 110 further includes processing logic 102. Operations of the processing logic 102 may be implemented in firmware; alternatively, it may be implemented in hardware or software. The processing logic 102 may receive signals from the capacitance sensor 101, and determine the state of the sensor array 121, such as whether an object (e.g., a finger) is detected on or in proximity to the sensor array 121 (e.g., determining the presence of the object), where the object is detected on the sensor array (e.g., determining the location of the object), tracking the motion of the object, or other information related to an object detected at the touch sensor.

In another embodiment, instead of performing the operations of the processing logic 102 in the processing device 110, the processing device 110 may send the raw data or partially-processed data to the host 150. The host 150, as illustrated in FIG. 1, may include decision logic 151 that performs some or all of the operations of the processing logic 102. Operations of the decision logic 151 may be implemented in firmware, hardware, software, or a combination thereof. The host 150 may include a high-level Application Programming Interface (API) in applications 152 that perform routines on the received data, such as compensating for sensitivity differences, other compensation algorithms, baseline update routines, start-up and/or initialization routines, interpolation operations, or scaling operations. The operations described with respect to the processing logic 102 may be implemented in the decision logic 151, the applications 152, or in other hardware, software, and/or firmware external to the processing device 110. In some other embodiments, the processing device 110 is the host 150.

In another embodiment, the processing device 110 may also include a non-sensing actions block 103. This block 103 may be used to process and/or receive/transmit data to and from the host 150. For example, additional components may be implemented to operate with the processing device 110 along with the sensor array 121 (e.g., keyboard, keypad, mouse, trackball, LEDs, displays, or other peripheral devices).

The processing device 110 may reside on a common carrier substrate such as, for example, an integrated circuit (IC) die substrate, or a multi-chip module substrate. Alternatively, the components of the processing device 110 may be one or more separate integrated circuits and/or discrete components. In one embodiment, the processing device 110 may be the Programmable System on a Chip (PSoC™) processing device, developed by Cypress Semiconductor Corporation, San Jose, Calif. Alternatively, the processing device 110 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or other programmable device. In an alternative embodiment, for example, the processing device 110 may be a network processor having multiple processors including a core unit and multiple micro-engines. Additionally, the processing device 110 may include any combination of general-purpose processing device(s) and special-purpose processing device(s).

In one embodiment, the electronic system 100 is implemented in a device that includes the touch-sensing surface 116 as the user interface, such as handheld electronics, portable telephones, cellular telephones, notebook computers, personal computers, personal data assistants (PDAs), kiosks, keyboards, televisions, remote controls, monitors, handheld multimedia devices, handheld video players, gaming devices, control panels of a household or industrial appliances, or other computer peripheral or input devices. Alternatively, the electronic system 100 may be used in other types of devices. It should be noted that the components of electronic system 100 may include all the components described above. Alternatively, electronic system 100 may include only some of the components described above, or include additional components not listed herein.

Figure 2:
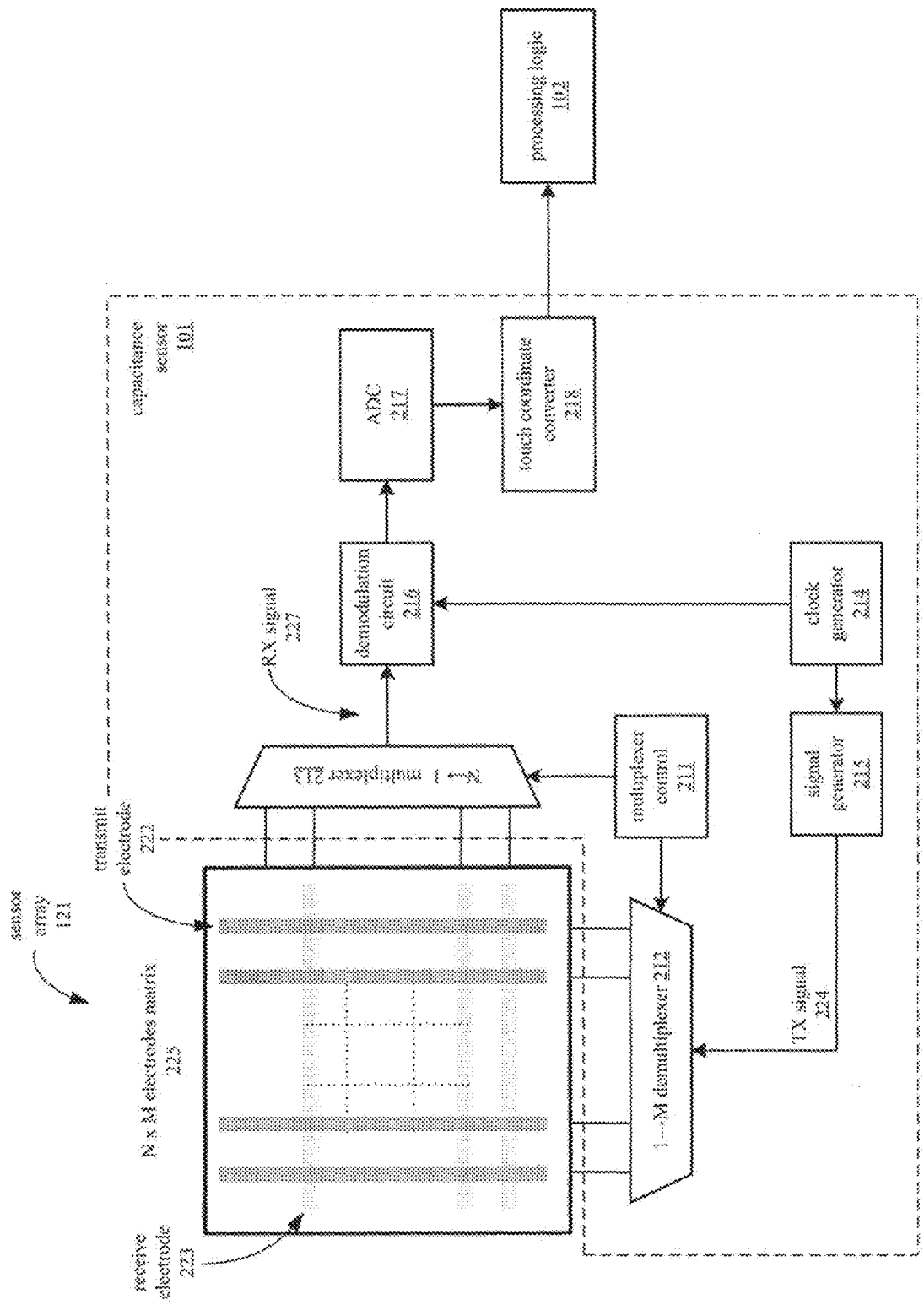
FIG. 2 is a block diagram illustrating an embodiment of an example sensor system that processes touch sensor data.

FIG. 2 is a block diagram illustrating one embodiment of a capacitive touch sensor array 121 and a capacitance sensor 101 that converts changes in measured capacitances to coordinates indicating the presence and location of touch. The coordinates are calculated based on changes in measured capacitances relative to the capacitances of the same touch sensor array 121 in an un-touched state. In one embodiment, sensor array 121 and capacitance sensor 101 are implemented in a system such as electronic system 100. Sensor array 220 includes a matrix 225 of N×M electrodes (N receive electrodes and M transmit electrodes), which further includes transmit (TX) electrode 222 and receive (RX) electrode 223. Each of the electrodes in matrix 225 is connected with capacitance sensing circuit 201 through demultiplexer 212 and multiplexer 213.

Capacitance sensor 101 includes multiplexer control 211, demultiplexer 212 and multiplexer 213, clock generator 214, signal generator 215, demodulation circuit 216, and analog to digital converter (ADC) 217. ADC 217 is further coupled with touch coordinate converter 218. Touch coordinate converter 218 may be implemented in the processing logic 102.

The transmit and receive electrodes in the electrode matrix 225 may be arranged so that each of the transmit electrodes overlap and cross each of the receive electrodes such as to form an array of intersections, while maintaining galvanic isolation from each other. Thus, each transmit electrode may be capacitively coupled with each or more of the receive electrodes. For example, transmit electrode 222 is capacitively coupled with receive electrode 223 at the point where transmit electrode 222 and receive electrode 223 overlap.

Clock generator 214 supplies a clock signal to signal generator 215, which produces a TX signal 224 to be supplied to the transmit electrodes of touch sensor 121. In one embodiment, the signal generator 215 includes a set of switches that operate according to the clock signal from clock generator 214. The switches may generate a TX signal 224 by periodically connecting the output of signal generator 215 to a first voltage and then to a second voltage, wherein said first and second voltages are different.

The output of signal generator 215 is connected with demultiplexer 212, which allows the TX signal 224 to be applied to any of the M transmit electrodes of touch sensor 121. In one embodiment, multiplexer control 211 controls demultiplexer 212 so that the TX signal 224 is applied to each transmit electrode 222 in a controlled sequence. Demultiplexer 212 may also be used to ground, float, or connect an alternate signal to the other transmit electrodes to which the TX signal 224 is not currently being applied. In an alternate embodiment the TX signal 224 may be presented in a true form to a subset of the transmit electrodes 222 and in complement form to a second subset of the transmit electrodes 222, wherein there is no overlap in members of the first and second subset of transmit electrodes 222.

Because of the capacitive coupling between the transmit and receive electrodes, the TX signal 224 applied to each transmit electrode induces a current within each of the receive electrodes. For instance, when the TX signal 224 is applied to transmit electrode 222 through demultiplexer 212, the TX signal 224 induces an RX signal 227 on the receive electrodes in matrix 225. The RX signal 227 on each of the receive electrodes can then be measured in sequence by using multiplexer 213 to connect each of the N receive electrodes to demodulation circuit 216 in sequence.

The mutual capacitance associated with each intersection between a TX electrode and an RX electrode can be sensed by selecting every available combination of TX electrode and an RX electrode using demultiplexer 212 and multiplexer 213. To improve performance, multiplexer 213 may also be segmented to allow more than one of the receive electrodes in matrix 225 to be routed to additional demodulation circuits 216. In an optimized configuration, wherein there is a 1-to-1 correspondence of instances of demodulation circuit 216 with receive electrodes, multiplexer 213 may not be present in the system.

When an object, such as a finger, approaches the electrode matrix 225, the object causes a change in the measured mutual capacitance between only some of the electrodes. For example, if a finger is placed near the intersection of transmit electrode 222 and receive electrode 223, the presence of the finger will decrease the charge coupled between electrodes 222 and 223. Thus, the location of the finger on the touchpad can be determined by identifying the one or more receive electrodes having a decrease in measured mutual capacitance in addition to identifying the transmit electrode to which the TX signal 224 was applied at the time the decrease in capacitance was measured on the one or more receive electrodes.

By determining the mutual capacitances associated with each intersection of electrodes in the matrix 225, the presence and locations of one or more conductive objects may be determined. The determination may be sequential, in parallel, or may occur more frequently at commonly used electrodes.

In alternative embodiments, other methods for detecting the presence of a finger or other conductive object may be used where the finger or conductive object causes an increase in measured capacitance at one or more electrodes, which may be arranged in a grid or other pattern. For example, a finger placed near an electrode of a capacitive sensor may introduce an additional capacitance to ground that increases the total capacitance between the electrode and ground. The location of the finger can be determined based on the locations of one or more electrodes at which a change in measured capacitance is detected.

The induced current signal 227 is integrated by demodulation circuit 216. The rectified current output by demodulation circuit 216 can then be filtered and converted to a digital code by ADC 217.

A series of such digital codes measured from adjacent sensor or intersections may be converted to touch coordinates indicating a position of an input on touch sensor array 121 by touch coordinate converter 218. The touch coordinates may then be used to detect gestures or perform other functions by the processing logic 102.

In one embodiment, the capacitance sensor 101 can be configured to detect multiple touches. One technique for the detection and location resolution of multiple touches uses a two-axis implementation: one axis to support rows and another axis to support columns. Additional axes, such as a diagonal axis, implemented on the surface using additional layers, can allow resolution of additional touches.

Figure 3A:
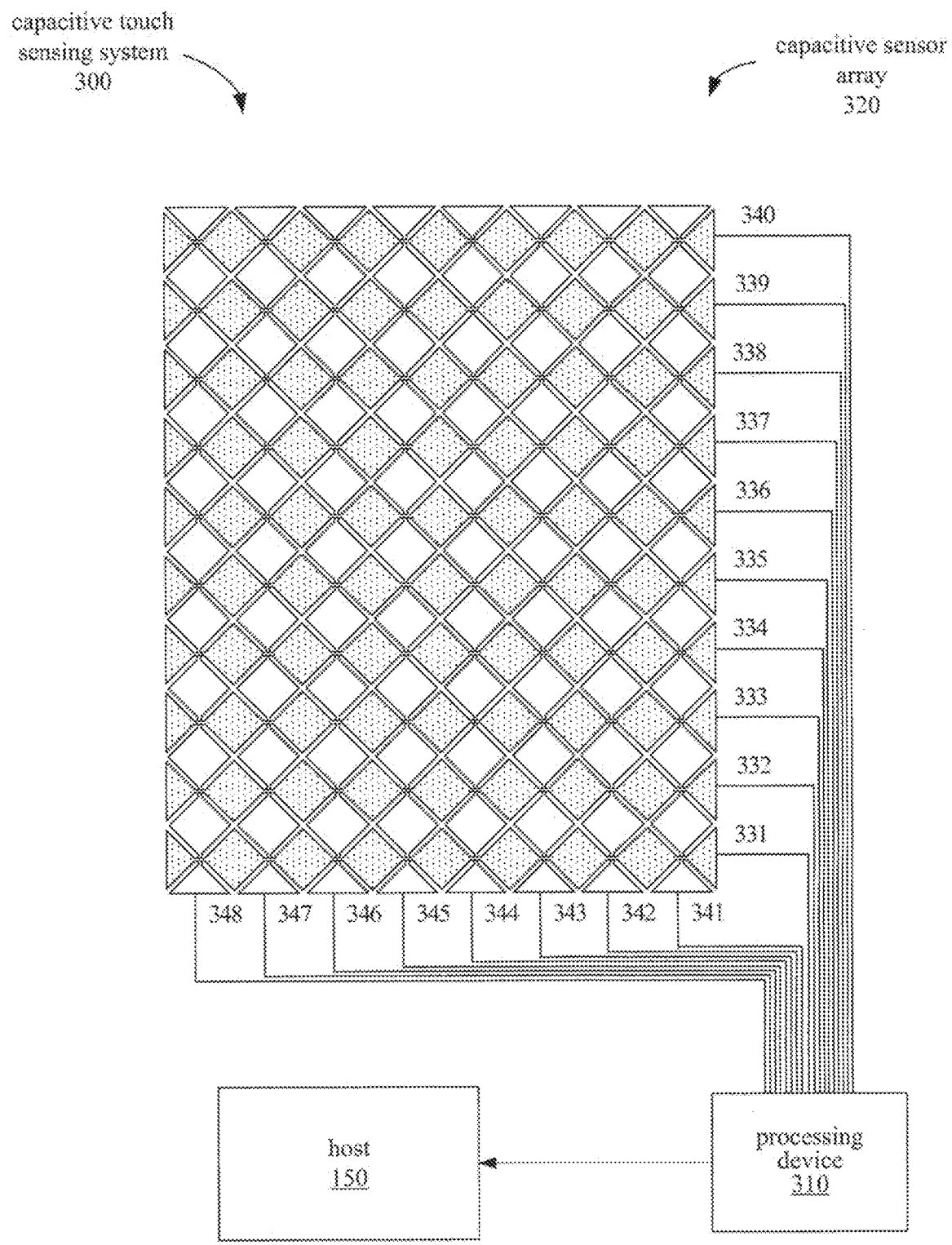
FIG. 3A illustrates an embodiment of an electronic touch-sensing system using a dual solid diamond capacitive sensor pattern.

FIG. 3A illustrates an embodiment of a capacitive touch sensing system 300 that includes a capacitive sensor array 320. Capacitive sensor array 320 includes a plurality of row sensor electrodes 331-340 and a plurality of column sensor electrodes 341-348. In one embodiment, the processing device 310 may perform TX-RX scans of the capacitive sensor array 320 to measure a mutual capacitance value associated with each of the intersections between a row sensor electrode and a column sensor electrode in the sensor array 320.

Figure 3B:
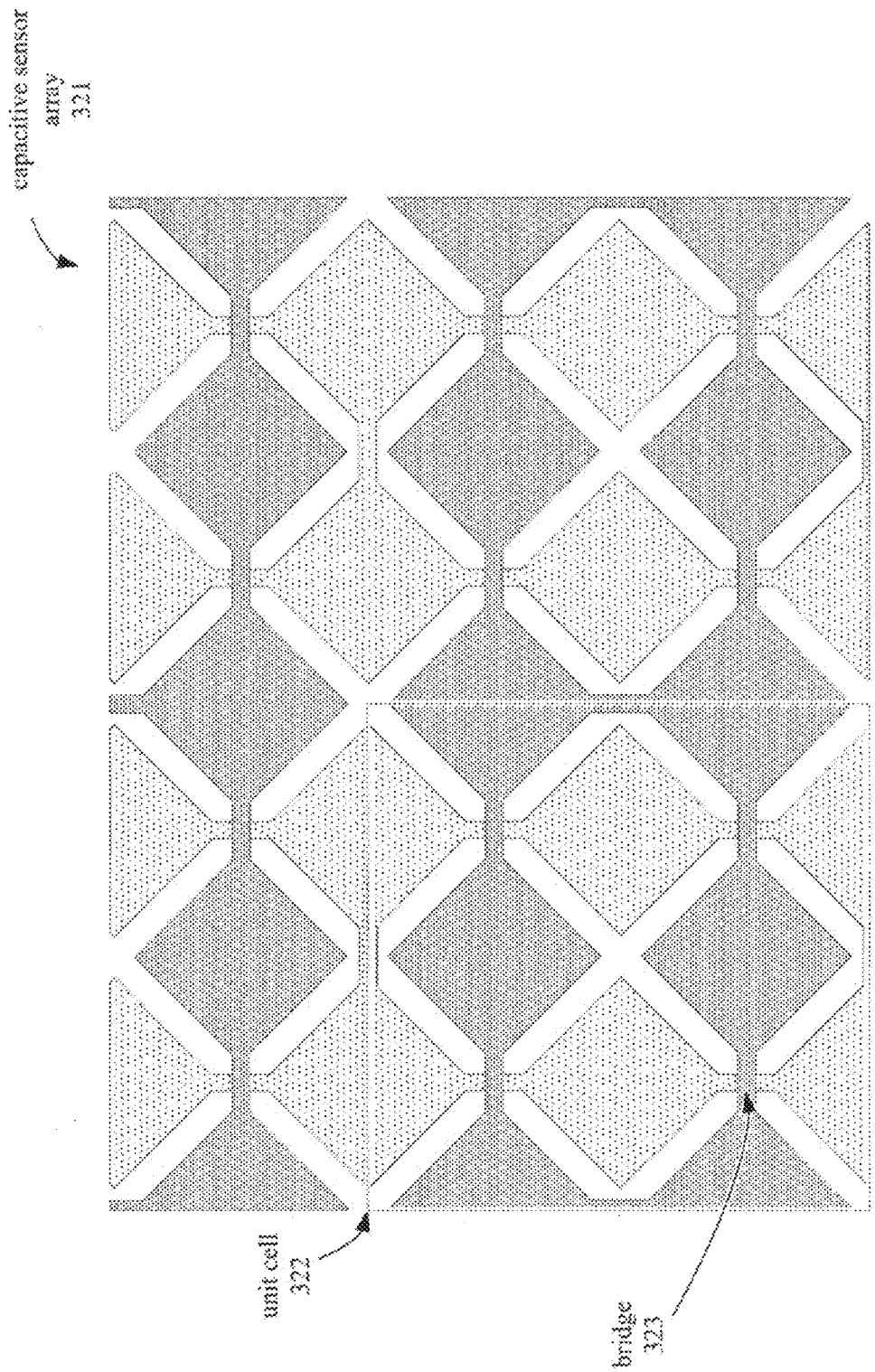
FIG. 3B illustrates an embodiment of a dual solid diamond capacitive sensor pattern.

The sensor array 320 illustrated in FIG. 3A includes sensor electrodes arranged in a diamond pattern. Specifically, the sensor electrodes 331-348 of sensor array 320 are arranged in a single solid diamond (SSD) pattern. FIG. 3B illustrates a capacitive sensor array 321 having an alternate embodiment of the diamond pattern, which is the dual solid diamond (DSD) pattern. Each of the sensor electrodes of capacitive sensor array 321 includes two rows or columns of electrically connected diamond shaped traces. DSD pattern has advantages over SSD pattern but it also increases the number of bridges (such as bridge 323) used to create the pattern, which may result in decreased manufacturing yield. The increased number of bridges may also be visible if metal bridges are used.

Figure 4A:
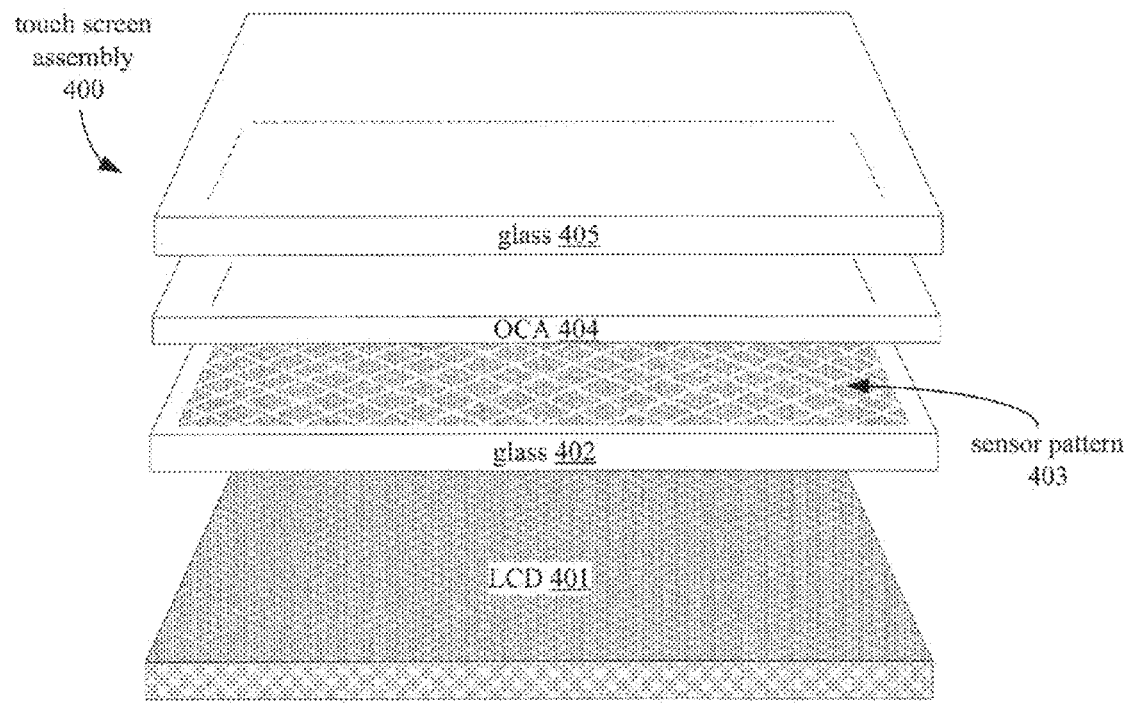
FIG. 4A illustrates components of a touch screen assembly, according to an embodiment.
Figure 4B:
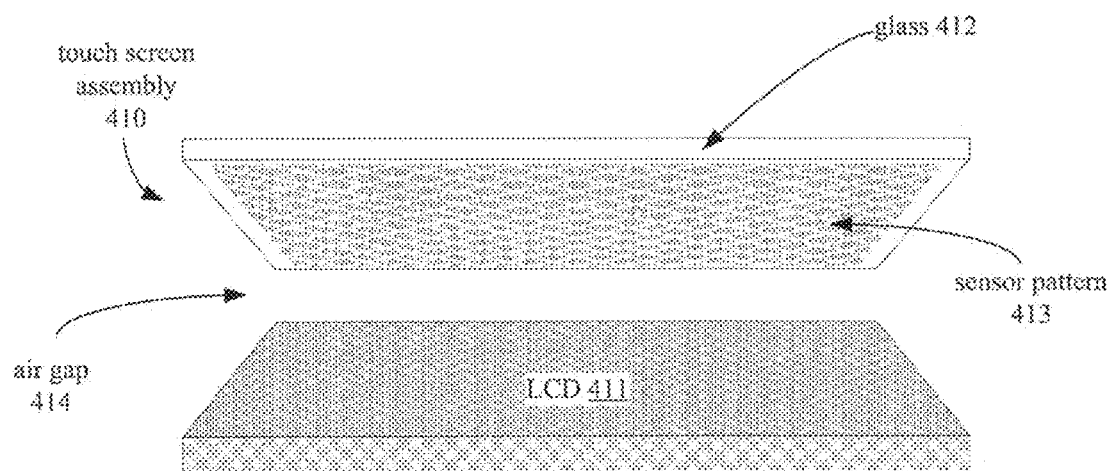
FIG. 4B illustrates components of a touch screen assembly, according to an embodiment.

FIGS. 4A and 4B illustrate embodiments of touch screen assemblies 400 and 410 respectively that include capacitive sensor arrays. Touch screen assembly 400 includes a liquid crystal display (LCD) 401 over which glass 402 is laid. A sensor pattern 403 is constructed on the surface of glass 402. In one embodiment, the sensor pattern 403 is constructed on the surface of glass 402 that faces away from the LCD 401. Optically clear adhesive (OCA) 404 may be used to bond glass 405 to the surface of glass 402 on which the sensor pattern 403 is constructed, thus protecting the sensor pattern 403. Other embodiments may include plastic (PET) substrate.

Touch screen assembly 410 includes an LCD 411, over which a glass 412 may be positioned. In one embodiment, sensor pattern 413 may be constructed on the surface of glass 412 that faces the LCD 411. In one embodiment, an air gap 414 may separate the glass 412 from the LCD 411.

Figure 5:
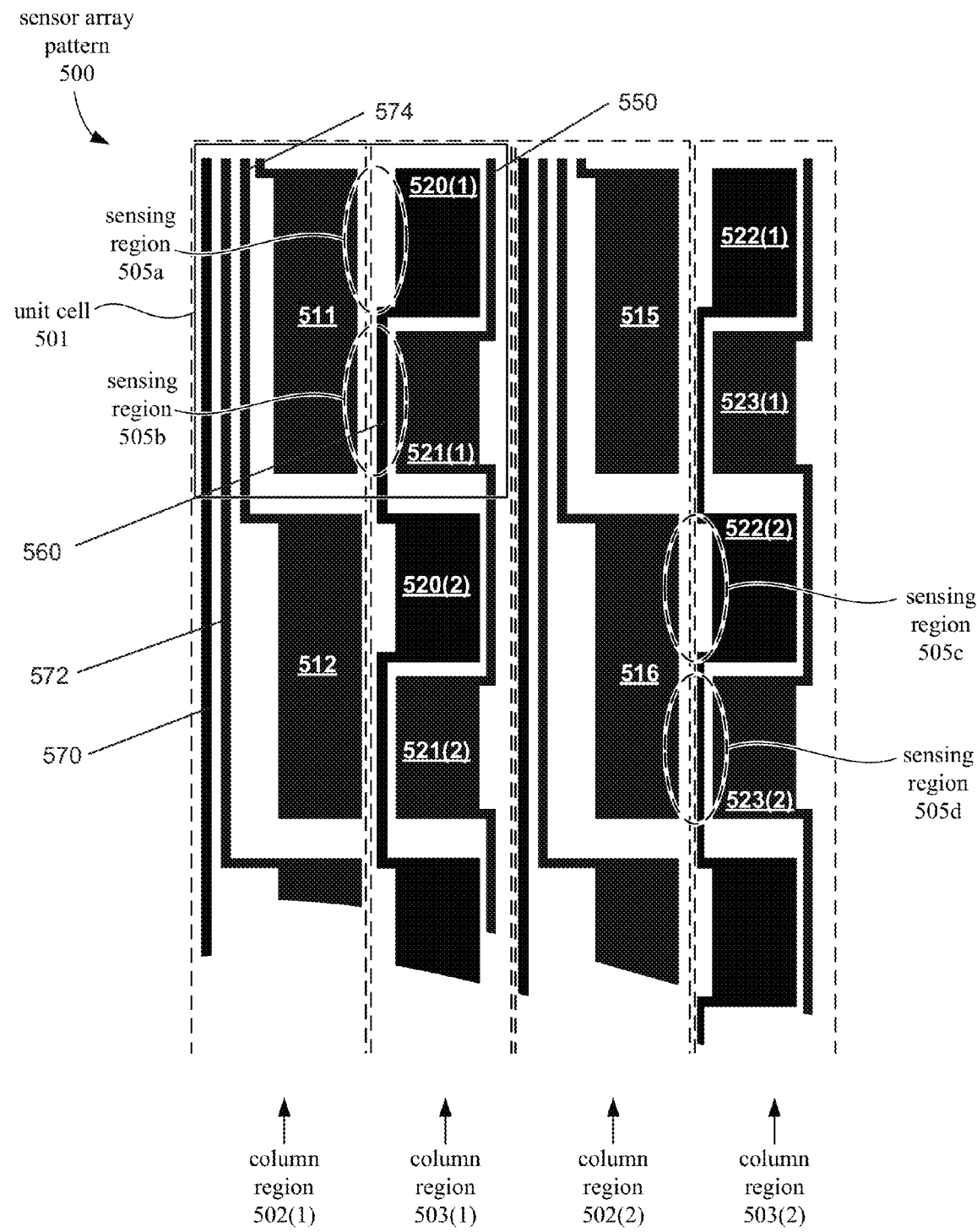
FIG. 5 illustrates a portion of a sensor array pattern, according to an embodiment.

FIG. 5 illustrates a portion of a capacitive sensor array pattern 500, according to an embodiment. As compared to the SSD or DSD patterns as described with reference to FIGS. 3A and 3B, the sensor array pattern 500 may be constructed from a single layer of conductive material, such as indium tin oxide (ITO) or copper, without bridges or overlapping areas.

The sensor array pattern 500 includes a first set of sensor electrodes each made up of one or more large subelements, such as subelements 511, 512, 515, and 516. The sensor array pattern 500 may further include a second set of sensor electrodes each made up of one or more small subelements, such as subelements 520(1), 520(2) 521(1), and 521(2). In one embodiment, the small subelements are in general smaller than the large subelements.

In one embodiment, the surface area of the sensor array pattern 500 may be considered as being divided into a grid of N×M unit cells, such as unit cell 501. The grid of unit cells thus has N rows of unit cells and M columns of unit cells. The area contained within unit cell 501 includes the large subelement 511 and two smaller subelements 520(1) and 521(1). In an alternative embodiment, the number of small subelements may vary from 1 to k, which k is a positive integer larger than 1. In one embodiment, in unit cell 501, small subelement 520(1) is electrically connected to other small subelements such as 520(2) in the same column region 503(1) via routing trace 560. Similarly, small subelement 521(1) is electrically connected to other small subelements such as 521(2) in the same column region 503(1) via routing trace 550. Large subelements, such as subelements 511, 512, 515, etc. are connected to one another in various configurations via routing traces 570, 572, 574, etc. Generally, electrical routing traces contribute to electromagnetic field distribution and thus modify mutual capacitance measurements in their adjacent area. In one embodiment, some routing traces, such as routing trace 560 is positioned between large element 511 and small element 521 and thus has more significant effect on the mutual capacitance measurement between large element 511 and small element 521.

In one embodiment, a capacitance sensor such as capacitance sensor 101, as illustrated in FIG. 1, may be configured to measure mutual capacitances between the large subelement 511 and the small subelements 520(1) and 521(1). Thus, for the unit cell 501, the capacitance sensor 101 may measure two mutual capacitance values. In one embodiment, each unit cell includes the regions of greatest capacitive coupling between the large subelement and the k small subelements. These regions of greatest capacitive coupling are the areas at which a mutual capacitance between the large subelement and small subelement may be most influenced by the presence of a conductive object. With reference to FIG. 5, for example, the unit cell 501 includes a first region 505a of greatest capacitive coupling between the large subelement 511 and the small subelement 520(1), and also includes a second region 505*b* of greatest capacitive coupling between the large subelement 511 and the small subelement 521(1). In one embodiment, routing trace 560 is positioned in the second region 505*b* and modifies the mutual capacitance measurement therein. On the other hand, for example, the mutual capacitance measurement at first region 505*a* receives much less influence from routing trace 550. As a result, there may be an asymmetry of mutual capacitance measurements amongst different regions of greatest capacitive coupling throughout sensor array pattern 500.

Thus, the resulting matrix of N×M measured mutual capacitance measurements may be transformed via a matrix transformation to generate a transformed matrix storing the capacitance values in positions that correspond to the actual locations of the sensing regions. In one embodiment, an N×M matrix of capacitance values may be transformed into a (N×k)×(M/k) matrix.

In one embodiment, the surface area of the capacitive sensor array pattern 500 may be considered as being divided into a number of column regions. In one embodiment, the area is divisible into two sets of column regions, where each column region in the first set includes the large sensor electrode subelements and each column region in the second set includes the small sensor electrode subelements. In one embodiment, each of the N×M unit cells would thus overlap one of the first set of column regions and one of the second set of column regions, forming M unit cell columns. For example, unit cell 501 overlaps both of column regions 502(1) and 503(1). In one embodiment, routing traces connecting large subelements, such as subelement 511, 512, 515, 516 etc. may also affect mutual capacitance measurements of regions of greatest capacitive coupling in adjacent unit cell columns. In another embodiment, column regions can be interchangeable with row regions.

Figure 6A:
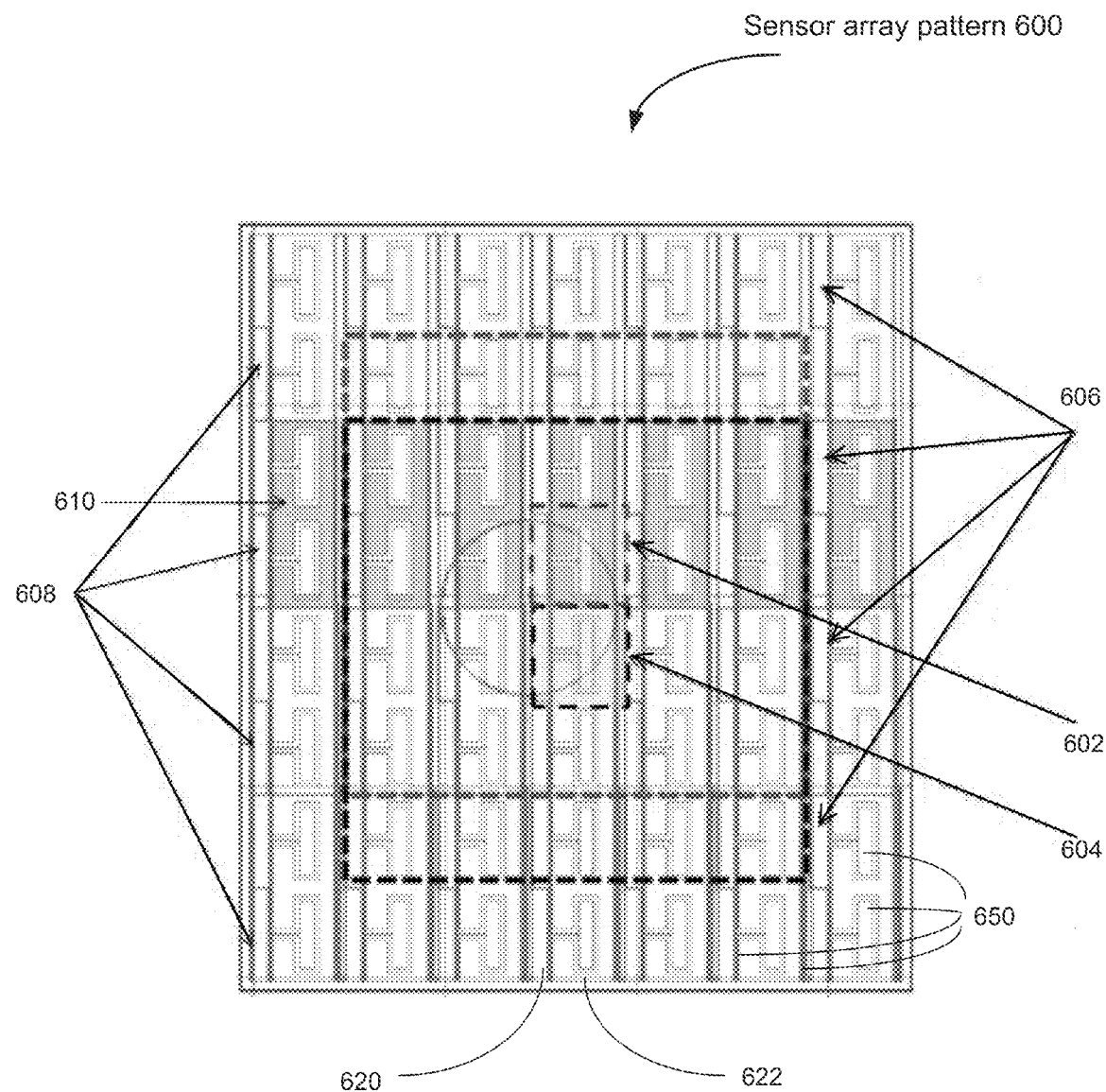
FIGS. 6A and 6B illustrate a portion of a sensor array pattern, according to an embodiment.

FIG. 6A illustrates a portion of a capacitive sensor array pattern 600, according to an embodiment. More specifically, FIG. 6A illustrates seven columns and four rows, or 28 unit cells of the grid of the N×M unit cells, of the sensor array pattern 600. Similar to the sensor array pattern 500 as described with reference to FIG. 5, capacitive sensor array pattern 600 may be considered as being divided into a grid of N×M unit cells, such as unit cell 602. The grid of unit cells thus has N rows of unit cells and M columns of unit cells. In one embodiment, each column of unit cell further includes 2 column regions. In another embodiment, rows and columns of N×M unit cells are interchangeable.

In one embodiment, capacitive sensor array pattern 600 includes a first set of sensor electrodes each made up of one or more large subelements 610 and may further include a second set of sensor electrodes each made up of one or more small subelements 606 and 608. In one embodiment, each of the small subelements is approximately equal in size with each of the other small subelements 606 and 608. In one embodiment, each of the large subelements is substantially equal in size with each of the other large subelements 610. In one embodiment, subelements that are substantially equal in size are designed to be nominally equal in size, but may have variations in size due to manufacturing processes.

Figure 6B:
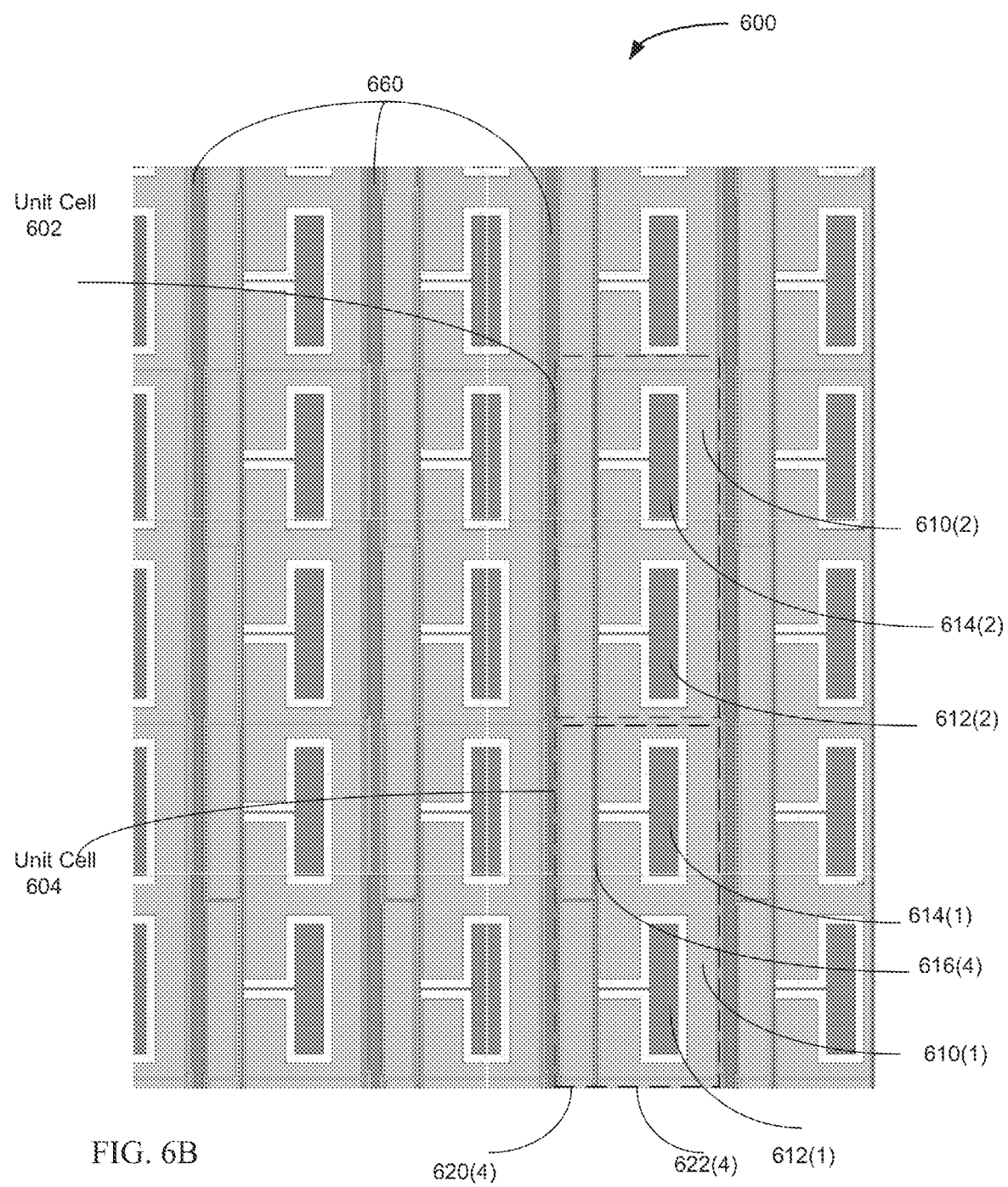

FIG. 6B illustrates six adjacent unit cells, of a portion of the sensor array pattern 600. With reference to FIGS. 6A and 6B, a first set of column regions may include column regions 622(4), which includes the large subelements 610(1), 610(2), etc. A second set of column regions may include column regions 620(4), which includes small subelements 606(1), 606(2), 608(1), 608(2), etc. In one embodiment, each of the column regions in the first set of column regions may include N large subelements, while each of the column regions in the second set of column regions may include N×k small subelements. For example, where k is equal to 2 as illustrated in FIG. 6A, a column region from the first set including 4 large subelements may be adjacent to a column region from the second set including 8 small subelements.

As compared to the sensor array pattern 500 in FIG. 5, the sensor array pattern 600 may include a third set of sensor electrodes or insertion electrodes 650, as illustrated in FIG. 6A. In one embodiment, third electrodes 650 may be disposed within each or at least some of the N×M unit cells. For example, in adjacent unit cell 602 and unit cell 604 in column region 622. In another embodiment, third electrodes 650 may also be positioned between adjacent unit cells. In one embodiment, the first, second and third set of sensor electrodes are formed from a single layer of conductive material, such as ITO.

One object of introducing a third or an insertion electrode is to balance the asymmetry in mutual capacitance values measured between a large subelement and multiple smaller subelements, due to the effect of routing traces, as previously described in FIG. 5. In one embodiment, the mutual capacitance values measured are translated into signal readout of the touch controller. The signal asymmetry produces panel response non-uniformity. As a result, accuracy of finger coordinate detection, sensor accuracy and linearity may be adversely affected. Besides, the introduction of the third electrodes 650 helps reduce the signal disparity effect. The third electrodes 650 also create more coupling between the device ground and the touch object. Furthermore, the third electrodes 650 reduce the total sensor electrode area, resulting in less parasitic coupling. The third electrodes 650 also allow larger maximum panel driving signal TX frequency, which is the panel speed.

As discussed, the sensor array pattern 600 may be divisible into a grid of N×M unit cells. Alternatively, the sensor array pattern 600 may be divisible into M×2 column regions and N row regions. In one embodiment where the surface area of the sensor array is substantially rectangular, each of the M×2 column regions may extend from a top edge of the surface area of the capacitive sensor array 600 to a bottom edge of the surface area. In one embodiment, each unit cell, such as unit cell 602, overlaps two column regions 620(4) and 622(4). With reference to FIG. 6B, column regions 620(1 to M) and 622(1 to M) interleave with each other without intercepting or any overlapping portions. In one embodiment, column region 622(4), which may have a similar configuration to other column regions 622(1 to M), includes a first set of sensor electrodes each made up of one or more large subelements, such as subelements 610(1), 610(2). Column region 620(4), which may have a similar configuration to other column regions 620(1 to M), includes a second set of sensor electrodes each made up of one or more small subelements, such as subelements 608(1 to N) and 606(1 to N). In one embodiment, subelements 608(1 to N) and 606(1 to N) have no overlapping portions, and may be electrically isolated from each other. In one alternative embodiment, the positions and configurations of column regions 620(1 to M) and 622(1 to M) may be interchangeable. In another alternative embodiment, rows and columns may also be interchangeable.

In one embodiment, a third set of sensor electrodes 650, each made up of one or more insertion subelements, such as subelements 612(1) and 614(1), may take shape of a rectangle and be inserted at least partially within some or all of the large subelements, such as subelements 610(1), 610(2). There are no overlapping portions between subelements 610(1 to N) and subelements 612(1 to N) and 614(1 to N). In one embodiment, other third electrodes 650, such as subelement 616(4), may take shape of an elongated electrode and be positioned between column regions 620(1 to M) and 622(1 to M). In another embodiment, third electrodes 650, such as subelement 660 may take shape of an elongated electrode and be disposed between unit cells of different unit cell columns. In yet another embodiment, third electrodes 650 may take shape of an elongated electrode and be disposed between unit cells of different unit cell rows. In one embodiment, some or all of the insertion subelements may be electrically coupled together by a switch or other type of connection during the sensing process. In one embodiment, this connection may be implemented in the capacitance sensor.

Figure 6C:
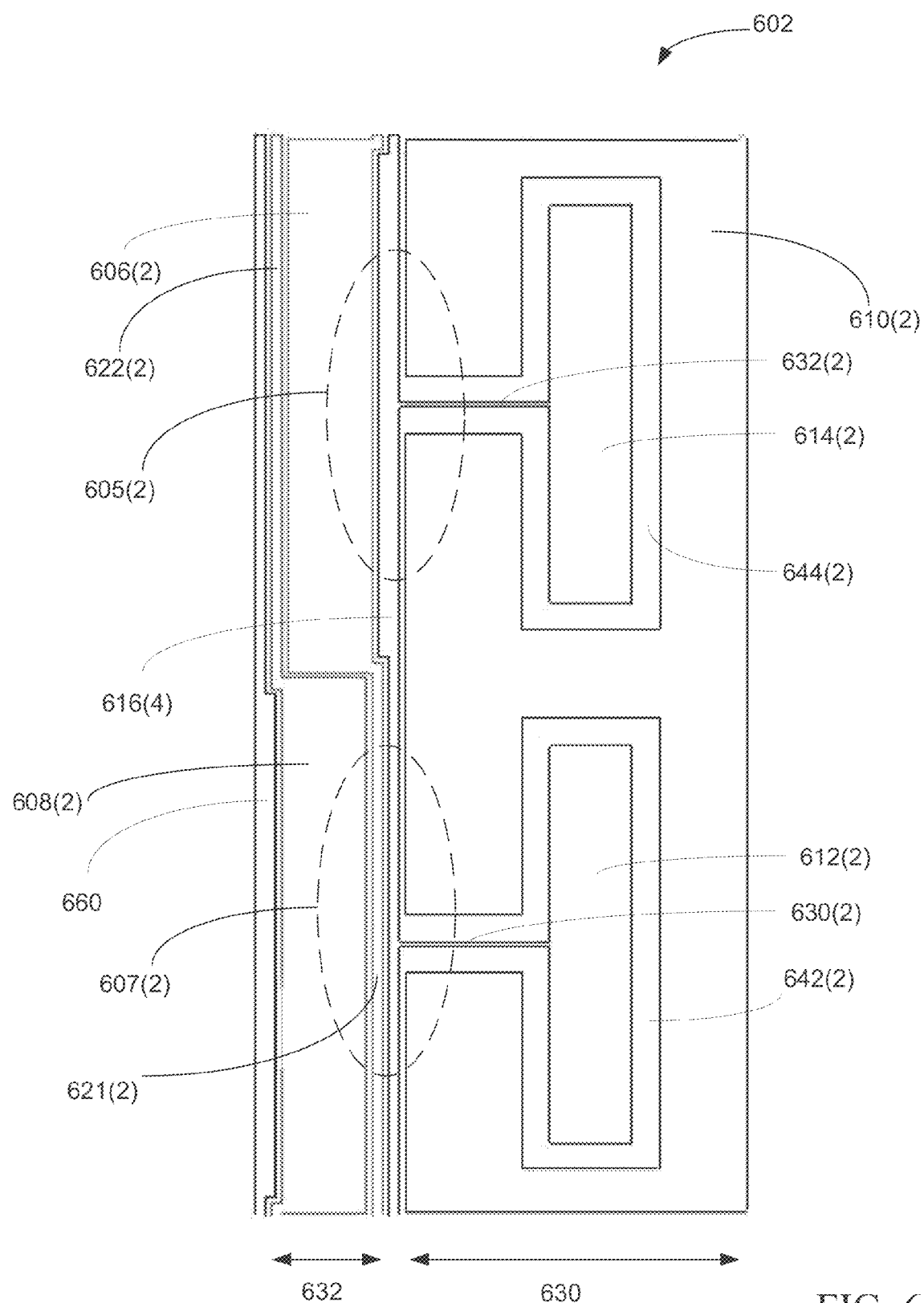
FIG. 6C illustrates a sensor array unit cell, according to an embodiment.

FIG. 6C illustrates unit cell 602 of the sensor array pattern 600. In one embodiment, unit cell 602, which is an example of a unit cell in the grid of N×M unit cells, includes one large subelement or subelement 610(2) and two small subelements or subelements 608(2) and 606(2). In alternative embodiments, other quantities of large and small subelements may be included in unit cell 602 or other unit cells in the grid of N×M unit cells. Subelement 610(2) has a width 630 and subelements 608(2) and 606(2) have a width 632 wherein width 630 is larger than width 632. With reference to FIG. 6C, there are two insertion subelements, namely subelements 612(2) and 614(2) positioned at least partially within subelement 610(2). Additionally, a narrow and elongated insertion subelement 616(4) is positioned between subelement 610(2) and subelements 608(2) and 616(2). Subelement 616(4) may or may not be extending to other unit cells of the same column. In one embodiment, subelement 610(2), subelements 608(2) and 616(2) and insertion subelements 612(2), 614(2) and 616(4) are formed from a single layer of conductive material such as ITO and have no overlapping portions to one another. In one embodiment, insertion subelements 612(2) and 614(2) are substantially identical. In an alternative embodiment, insertion subelements 612(2) and 614(2) may have different shapes and/or sizes.

With reference to FIG. 6C, in one embodiment, subelement 610(2) may take the shape of a hollow rectangle that has two T-shape apertures 642(2) and 644(2) positioned therein. T-shape apertures 642(2) and 644(2) may or may not be identical. In one embodiment, subelements 612(2) and 614(2) are inserted within T-shape apertures 642(2) and 644(2) respectively, of subelement 610(2). Each of the T-shape apertures 642(2) and 644(2) has an opening 652(2) and 654(2) to allow subelements 612(2) and 614(2) to connect to subelement 616(4) via connecting traces 630(2) and 632(2) respectively. In one embodiment, subelement 616(4) may connect some or all insertion subelements 612(1 to N) and 614(1 to N) of the same column region 622(4) electrically. In one embodiment, adjacent to unit cell 602, elongated insertion subelement 660 is positioned in the space between unit cell 602 and unit cells in the adjacent unit cell columns.

With reference to FIG. 6C, unit cell 602 includes a region of greatest capacitive coupling 605(2) between large subelement 610(2) and small subelement 606(2). Similarly, unit cell 602 also includes a region of greatest capacitive coupling 607(2) between large subelement 610(2) and small subelement 608(2). These regions of greatest capacitive coupling 605(2) and 607(2) are the areas at which a mutual capacitance between the large subelement and each of the small subelements may be most influenced by the presence of a conductive object. Thus, for unit cell 602, the capacitance sensor 101 may measure two mutual capacitance values or measurements as large subelement 610(2) is capacitively coupled with small subelement 612(2) and small subelement 614(2) respectively. Generally, the capacitance sensor 101 may measure k mutual capacitance values or measurements, including one mutual capacitance value for each pairing of the large subelement with each of k small subelements in a unit cell. In one embodiment, insertion subelements 612(2) and 614(2) and 616(4) are adjacent to or at least partially positioned in these regions of greatest capacitive coupling 605(2) and 607(2) to equalize sensing signal responses.

In one embodiment, third electrodes 650 or insertion subelements are connected by a switch or other types of connection to a capacitance sensor controller 101 as in FIG. 2 and one another. Optionally, third electrodes 650 may be coupled to the first electrodes 610 and/or the second electrodes 606 and 608. In one embodiment, third electrodes are coupled to ground, a ground node or chip ground to balance the asymmetry of mutual capacitance measurements between the first electrodes 610 and the second electrodes 606 and 608. In another embodiment, third electrodes are coupled to a sensor controller, such as processing device 110 as in FIG. 1 to compensate the field distribution change when sensor array 600 is in mutual capacitance mode. In yet another embodiment, third electrodes are coupled to a sensor driver, such as signal generator 215 to reduce self capacitance and improve water rejection algorithm in self capacitance mode. In yet another embodiment, third electrodes are coupled to a receive (RX) sense circuit, such as demodulation circuit 216. In yet another embodiment, third electrodes are coupled to a transmit (TX) signal driver in mutual capacitance mode. In yet another embodiment, third electrodes 650 are selectively coupled to large subelements and/or small subelements via electrical coupling. In yet another embodiment, third electrodes 650 are coupled to a shield signal.

In one embodiment, small subelements 606(1 to N) and 608(1 to N) in the same column region 620(4) are electrically isolated from one another. With reference to FIG. 6C, small subelement 608(2) are coupled electrically to other small subelements 608(1 to N) in the same column region 620(4) via routing trace 622(4). Similarly, small subelement 606(2) is coupled electrically to other small subelements 606(1 to N) via routing trace 621(4). In one embodiment, routing traces 621(4) and 622(4) have a width that is less than the width 632 of small subelements 606(1 to N) and 608(1 to N). Moreover, routing traces 621(4) and 622(4) extend in a direction which is parallel to all column regions 620(1 to M) of the sensor array pattern 600. In one embodiment, traces 621(4) and 622(4) are positioned on the opposite sides of small subelements 608(1 to N) and 606(1 to N) respectively. As illustrated in FIG. 6C, trace 621(4), which connects small subelements 606(1 to N), is positioned between small subelement 608(2) and large subelement 610(2). In general, electrical traces, such as routing trace 621(4), contribute in electromagnetic field distribution and modify mutual capacitance between small subelement 608(2) and large subelement 610(2) at the region of greatest capacitive coupling 607(2). As a result, trace 621(4) contributes to the signal asymmetry between adjacent unit cells, such as unit cells 602 and unit cells 604, as previously discussed. In one embodiment, insertion subelements 616(4), 612(2) and 614(2), which are adjacent or in the regions of greatest capacitive coupling 607(2) and 605(2), may help to equalize sensing signal responses. The effect of trace 622(4) on the signal asymmetry is considered smaller due to its routing configuration and the distance away from the region of greatest capacitive coupling 605(2). In one embodiment, subelements 616(4), 612(2) and 614(2) are connected to a ground node when sensor array 600 is in mutual capacitance mode to reduce the asymmetry of capacitance measurements of different regions of greatest capacitive coupling, such as regions 605(2) and 607(2). In other embodiments, the width of subelement 616(4), the size, shape, position of subelements 612(2) and 614(2) are adjustable in order to minimize signal asymmetry of sensor array 600.

Figure 7A:
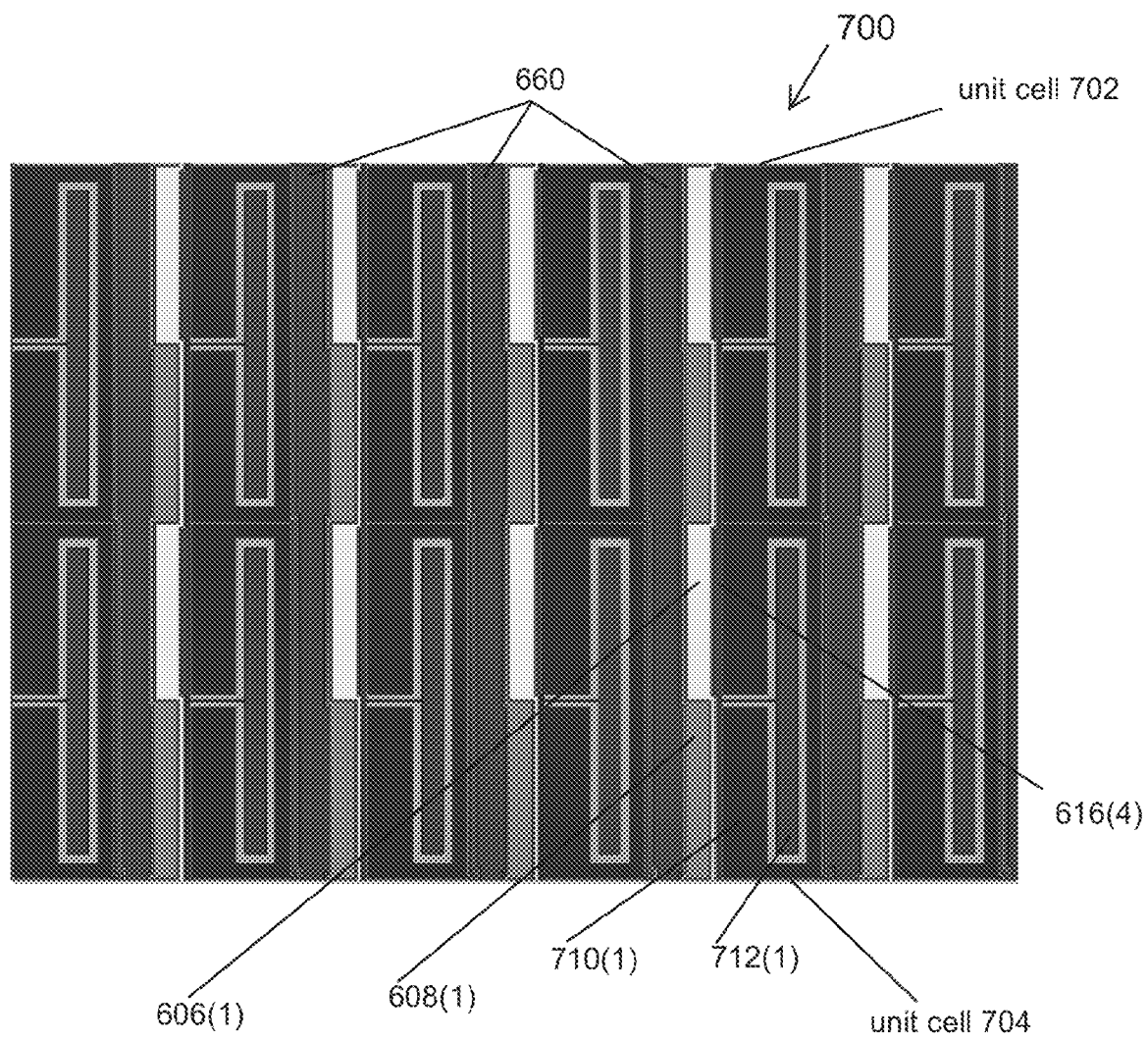
FIG. 7A illustrates a sensor array unit cell, according to an embodiment.
Figure 7B:
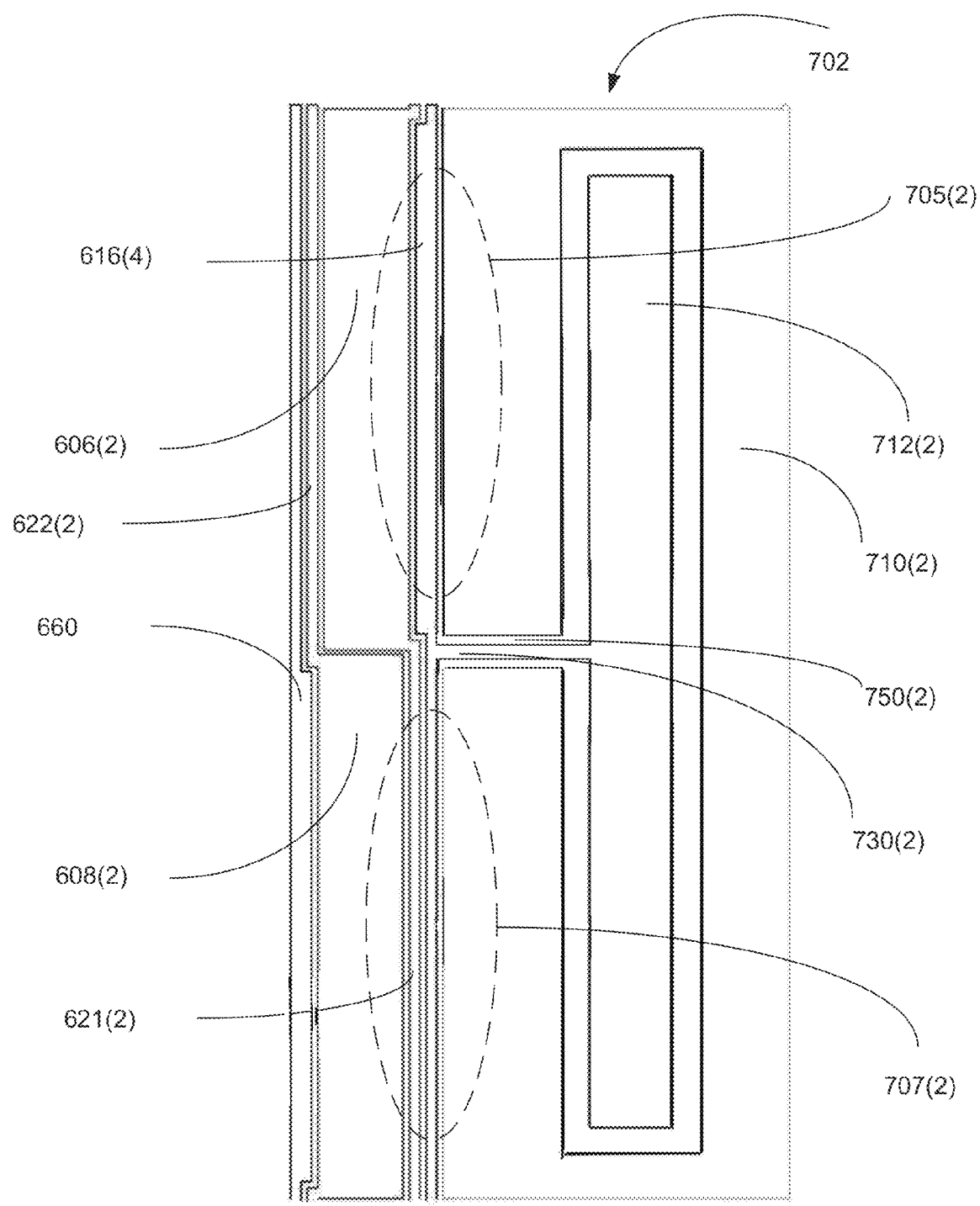
FIG. 7B illustrates a portion of a sensor array pattern, according to an embodiment.

FIG. 7A illustrates six columns and two rows, or 12 unit cells of the sensor array pattern 700. FIG. 7B illustrates unit cell 702 of a sensor array pattern 700. As compared to the embodiment of unit cell 602, large subelement 710(2) may have only one aperture 742(2). Besides, there may be only one insertion subelement 712(2) which is inserted within the large subelement 710(2). Large subelement 710(2) may have one or more opening(s) 752(2) such that insertion subelement 712(2) may extend beyond the boundary of large subelement 710(2) and connect to subelement 716(4) via connecting trace 730(2). In one alternative embodiment, the shape, position and size of subelement 712(2) may be different.

In one embodiment, all unit cells within the grid of N×M unit cells of the sensor array pattern 600 have the same structure, as in unit cell 602 or unit cell 702. In another embodiment, some unit cells may have a different configuration. For example, some unit cells may have a different number of large subelement(s), small subelement(s) and/or insertion subelement(s). Moreover, sizes, shapes and orientation of insertion subelements may be different in alternative embodiments.

Figure 8A:
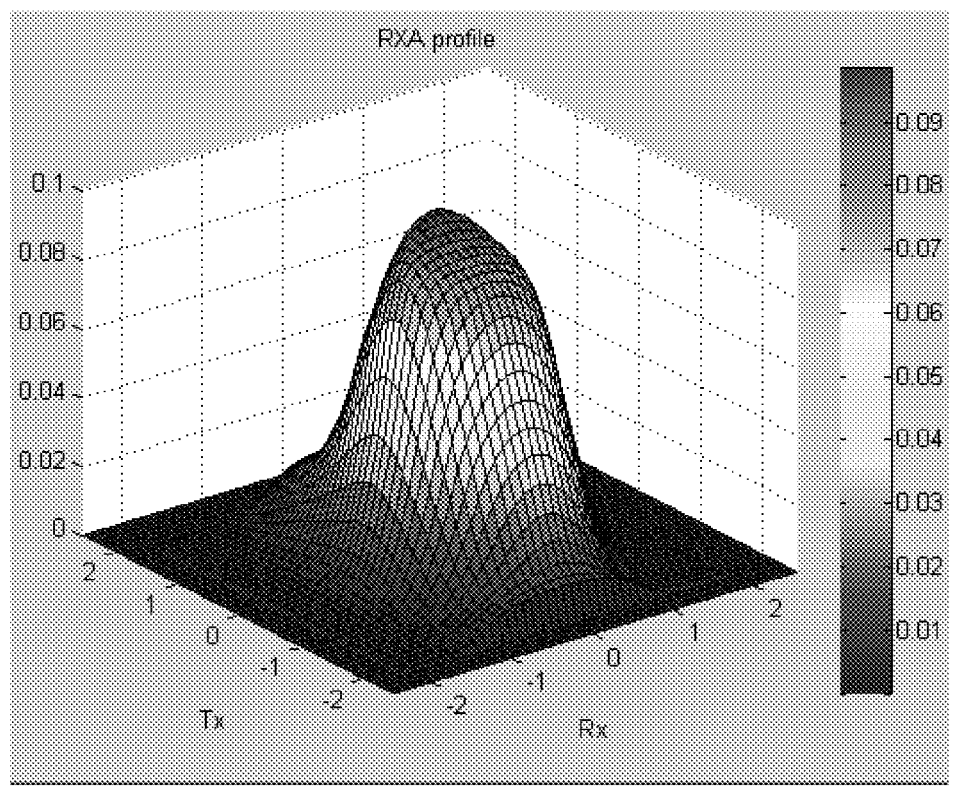
FIGS. 8A and 8B illustrate a three-dimensional plot of example response functions for the sensor elements of a touch sensor, e.g., such as the touch sensor illustrated in FIG. 6B.
Figure 8B:
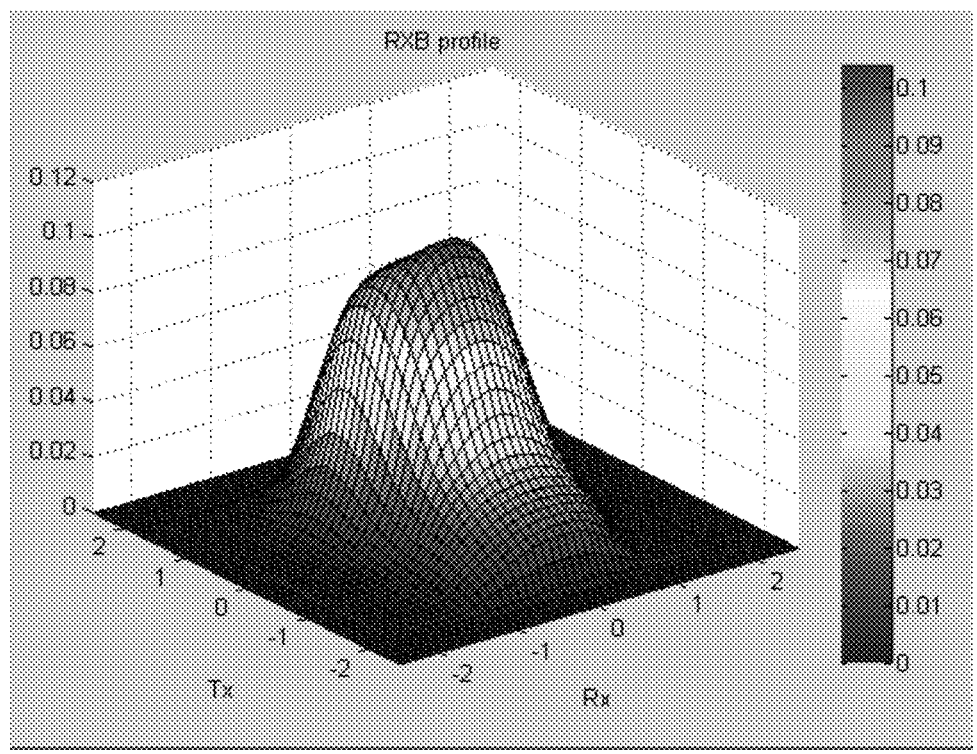
Figure 8C:
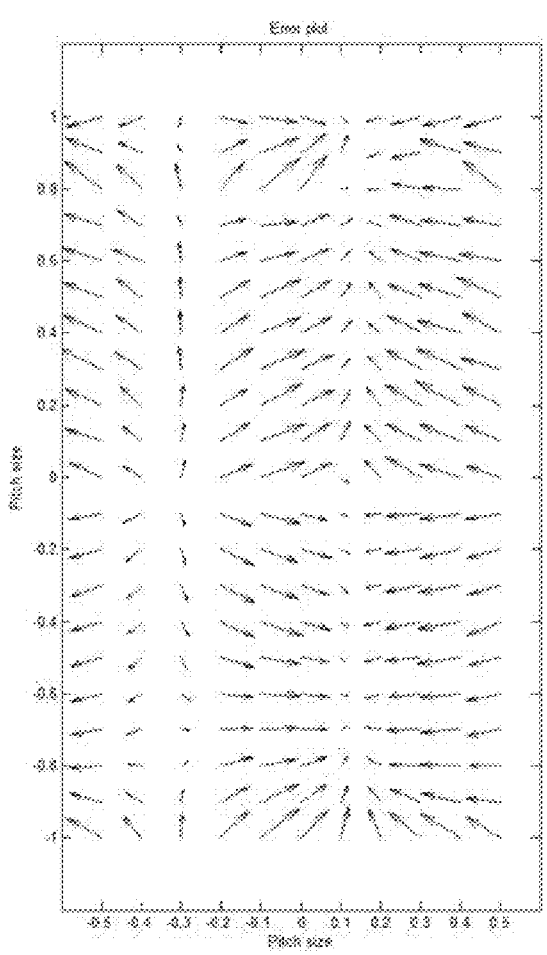
FIGS. 8C and 8D illustrate an error plot for two adjacent unit cells of a sensor array, e.g., such as the touch sensor illustrated in FIG. 6B.
Figure 8D:
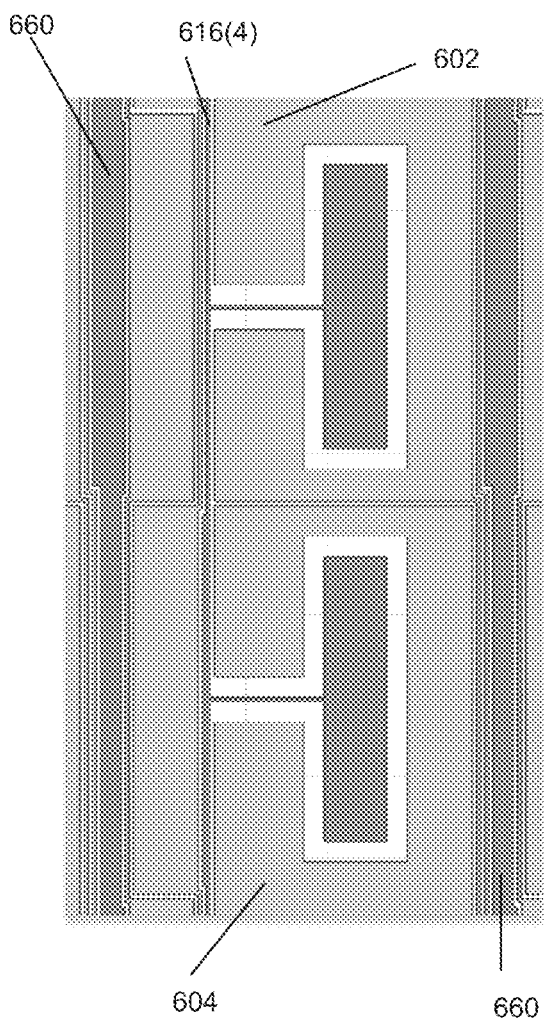

FIGS. 8A and 8B illustrate a three-dimensional plot of example response functions for the sensor elements of a touch sensor (e.g., the touch sensor illustrated in FIG. 6B). More specifically, FIG. 8A shows the signal responses (ACm) vs. 9 mm finger positions in the lower portion of unit cell 602 and FIG. 8B shows the same signal responses in the upper portion of an adjacent unit cell 604, as illustrated in FIG. 8D. With reference to FIGS. 8A and 8B, they show both signal profiles have a tail. The tail effect, which is directed to the opposite sides of adjacent unit cell 602 and unit cell 604, is caused by routing traces, such as 621(4) and 622(4) connecting the alternating second electrodes such as small subelements 606 and 608 in FIG. 6C. The tail effect can be compensated by implementing tail correction algorithms or by subtracting a "bias" correction vector. FIG. 8C illustrates the error map for 9 mm finger after subtraction a "bias" vector from detected finger positions by centroid algorithm directed to the same opposite sides of adjacent unit cell 602 and unit cell 604.

Figure 9:
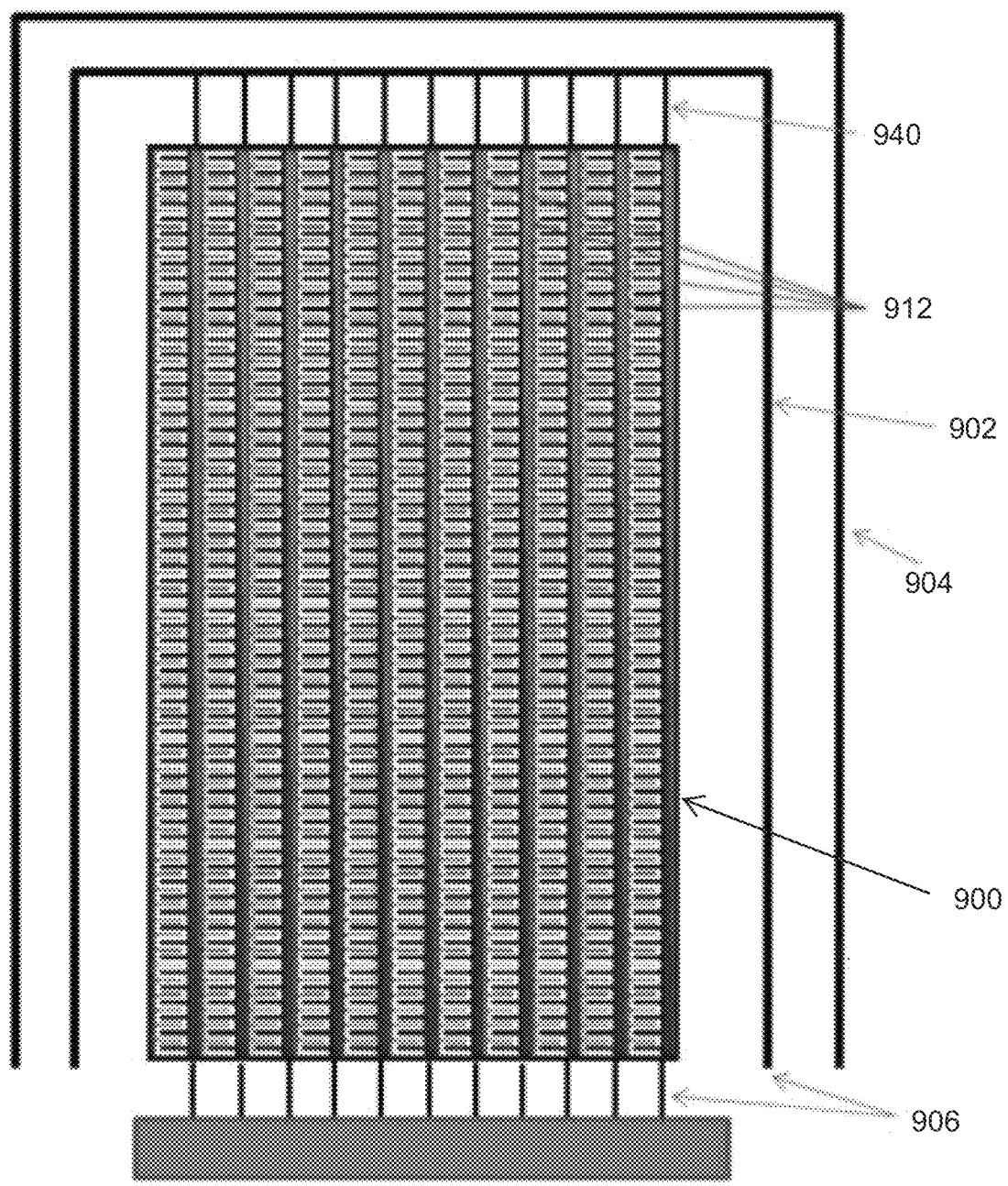
FIG. 9 illustrates connectivity of a sensor array pattern, according to an embodiment.

FIG. 9 illustrates an example of connectivity of a sensor array pattern 900, according to an embodiment. In one embodiment, third electrodes 912 of a same column region are connected via routing traces 940 to internal ring 902. Internal ring 902 may be connected to a shield drive and/or a ground node. With reference to FIG. 9, first and second electrodes of the same column region are coupled by multiple routing traces 906, in which the multiple routing traces 906 may be connected to a shield drive and/or a ground node. In one embodiment, outer ESD-ring is connected to ground.

In the foregoing embodiments, various modifications can be made; for example, row sensor electrodes and column sensor electrodes may be interchanged, and row or column sensor electrodes may be used as either TX or RX sensor electrodes. Similarly, sensor electrodes comprising large subelements may be used as TX or RX sensor electrodes and sensor electrodes comprising small subelements may be used as RX or TX sensor electrodes. Furthermore, in some embodiments, intersections between row and column sensor electrodes may be replaced with conductive bridges. For example, bridges may be used to electrically connect portions of sensor electrodes when both row and column sensor electrodes are constructed from a single layer of conductive material. As described herein, conductive electrodes that are "electrically connected" or "electrically coupled" may be coupled such that a relatively low resistance conductive path exists between the conductive electrodes.

In some embodiments, a touch sensor may be formed by laying out the sensor electrodes using alternative conductive materials such as metal mesh. In such embodiments, the sensor electrodes are formed by disposing metal mesh electrodes on PET substrate. In alternative embodiments, the metal mesh sensor electrodes may be disposed on glass substrate. In other embodiments, the sensor electrodes may be formed with silver nano-wires on PET or silver nano-wire on glass substrate. In other embodiments, a touch sensor may be formed by bonding a glass (or other transparent insulating) lens onto another glass with the sensor electrode pattern disposed on. In yet other embodiments, the touch sensor may be formed by bonding glass (or other transparent insulating material) onto a sheet of PET containing the sensor pattern.

In some embodiments, a single-layer structure may be used in the active area of the touch sensor, while a multi-layer structure may be used in the bezel (or other non-sensing) portions of the touch sensor for routing the secondary traces. Such multi-layer secondary routing allows the repeated use of the secondary traces so that the touch sensor uses the minimum number of traces and the minimum number of pins on the electronic system which drives the touch sensor, thereby reducing the associated manufacturing costs.

In some embodiments, the techniques described herein may be used not only for mutual-capacitance touch sensors, but also for touch-sensors that can operate in self-capacitance mode and/or in mixed mutual-capacitance/self-capacitance mode. Such application of the techniques described herein is possible for self-capacitance touch sensors because they also provide multiple sensor elements that can be measured and that can produce a signal profile that can be analyzed.

Various embodiments of the techniques for design of single-layer touch sensors described herein may include or use various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may include or use operations that are implemented as a computer program product that may include instructions stored on a non-transitory computer-readable medium, e.g., such as volatile storage and/or non-volatile storage. These instructions may be used to program a touch-sensing device that includes one or more general-purpose or special-purpose processors (e.g., such as Central Processing Units, or CPUs) or equivalents thereof (e.g., such as processing cores, processing engines, microcontrollers, and the like), so that when executed by the processor(s) or the equivalents thereof, the instructions cause the device to perform the desired operations. A computer-readable medium may also include one or more mechanisms for storing or transmitting information in a form (e.g., software, processing application) that is readable by a machine (e.g., such as a device or a computer). The non-transitory computer-readable storage medium may include, but is not limited to, electromagnetic storage medium (e.g., floppy disks, hard disks, and the like), optical storage medium (e.g., CD-ROM), magneto-optical storage medium, read-only memory (ROM), random-access memory (RAM), erasable programmable memory (e.g., EPROM and EEPROM), flash memory, or another now-known or later-developed type of medium that is suitable for storing information.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A sensor array, comprising:
   a plurality of first electrodes and a plurality of second electrodes, wherein each first electrode is coupled with at least one of the second electrodes via a mutual capacitance when the sensor array is in mutual capacitance mode; and
   a plurality of third electrodes disposed between the first electrodes and the second electrodes, wherein at least one first electrode includes at least one opening formed therein and one third electrode of the plurality of third electrodes is at least partially disposed within each opening,
   wherein the first electrodes, the second electrodes and the third electrodes are interleaved without intersecting one another and formed from a single layer of conductive material, and
   wherein a surface area of the sensor array is divisible into a grid of N×M unit cells, wherein N and M are positive integers, wherein each of the N×M unit cells contains one first electrode, k second electrodes, and at least one third electrode, wherein the number of unit cells is greater than or equal to 2, and wherein k is greater than or equal to 2.

2. The sensor array of claim 1, wherein each mutual capacitance between the first electrodes and the second electrodes includes a mutual capacitance measurement, wherein the third electrodes are configured to reduce an asymmetry of the mutual capacitance measurements between the first electrodes and the second electrodes.

3. The sensor array of claim 2, wherein at least one third electrode is configured to be electrically coupled to a ground node when the sensor array is in mutual capacitance mode.

4. The sensor array of claim 1, wherein at least one third electrode is configured to be electrically coupled to a sensor driver when the sensor array is in self capacitance mode.

5. The sensor array of claim 1, wherein at least one third electrode is configured to be electrically coupled to a shield signal.

6. The sensor array of claim 1, wherein at least one third electrode is coupled to a sensor controller configured to selectively and electrically couple the at least one third electrode to a transmit (TX) driver or a receive (RX) sense circuit.

7. The sensor array of claim 1, wherein each of the first electrodes is wider than any of the second electrodes.

8. The sensor array of claim 1, wherein each of the third electrodes disposed at least partially within the openings is substantially identical and rectangular.

9. The sensor array of claim 1, wherein each of the third electrodes disposed at least partially within the openings is different at least in one of size, shape or orientation.

10. The sensor array of claim 1, wherein each of the second electrodes is connected electrically to a different second electrode via a plurality of electrical traces, wherein at least one electrical trace is disposed between the first electrodes and the second electrodes and contributing to the asymmetry of the mutual capacitance measurements between the first electrodes and the second electrodes, wherein at least one third electrode is disposed between the at least one electrical trace and the first electrodes.

11. A capacitive sensor array, comprising:
    a first set of sensor electrodes each comprising one or more large subelements;
    a second set of sensor electrodes each comprising one or more small subelements, wherein each of the small subelements is smaller than any of the large subelements; and
    a third set of sensor electrodes each comprising one or more insertion subelements, wherein the insertion subelements are disposed between the large subelements and the small subelements,
    wherein the first set of sensor electrodes, the second set of sensor electrodes and the third set of sensor electrodes are interleaved without intersecting one another and formed from a single layer of conductive material, and
    wherein a surface area of the capacitive sensor array is divisible into a grid of N×M unit cells, wherein N and M are positive integers, wherein each of the N×M unit cells contains one of the large subelements, k of the small subelements, and at least one of the insertion elements, wherein the number of unit cells is greater than or equal to 2, and wherein k is greater than or equal to 2.

12. The capacitive sensor array of claim 11, wherein at least one of the unit cells includes a first region of greatest capacitive coupling between the large subelement and a first small subelement and a second region of greatest capacitive coupling between the large subelement and a second small subelement, wherein the first small subelement and the second small subelement are arranged along an axis parallel to a longitudinal axis of the large subelement and electrically isolated from each other, and wherein the at least one of the insertion subelements is disposed at least partially within the first region and the second region to reduce an asymmetry of capacitance measurements between the large subelement and the first and second small subelements.

13. The capacitive sensor array of claim 11, wherein the insertion subelements are electrically coupled to a ground node in at least one operation mode.

14. The capacitive sensor array of claim 11, wherein the insertion subelements are selectively and electrically coupled to a ground node, a TX driver, a RX sense circuit or a shield signal.

15. The capacitive sensor array of claim 11, wherein at least one of the insertion subelements is electrically coupled to a sensor driver configured to drive the at least one of the insertion subelements in self capacitance mode.

16. The capacitive sensor array of claim 11, wherein the surface area of the capacitive sensor array is divisible into M columns of the unit cells, wherein at least one of the insertion subelements is disposed between two of the M columns of the unit cells.

17. The capacitive sensor array of claim 11, wherein the one large subelement in at least one unit cell defines a hollow shape, wherein the at least one of the insertion subelements is disposed at least partially within the hollow shape.

18. A system, comprising:
    a capacitance sensor; and
    a sensor array includes:
      a plurality of first electrodes and a plurality of second electrodes, wherein each first electrode is capacitively coupled with at least one of the second electrodes, generating a mutual capacitance measurement, and a plurality of third electrodes disposed between the first electrodes and the second electrodes, wherein the third electrodes are configured to reduce an asymmetry of the mutual capacitance measurements between the first electrodes and the second electrodes and wherein the first electrodes, the second electrodes and the third electrodes are interleaved without intersecting one another and formed from a single layer of conductive material, wherein a surface area of the sensor array is divisible into a grid of N×M unit cells, wherein N and M are positive integers, wherein each of the N×M unit cells contains one first electrode, k second electrodes, and at least one third electrode, wherein the number of unit cells is greater than or equal to 2, and wherein k is greater than or equal to 2, and wherein the capacitance sensor is configured to:
selectively operate the sensor array in mutual capacitance mode or self capacitance mode, and
selectively couple at least one third electrode to at least one of a ground node when the sensor array is in mutual capacitance mode, a sensor driver when the sensor array is in self capacitance mode, a shield signal, a RX sense circuit, or a TX signal driver.

19. The system of claim 18, wherein at least one third electrode is inserted at least partially within the first electrodes.

* * * * *